(12) United States Patent
Kostarnov

(10) Patent No.: US 6,489,830 B1
(45) Date of Patent: Dec. 3, 2002

(54) APPARATUS AND METHOD FOR IMPLEMENTING A MULTIPLEXER

(75) Inventor: Igor Kostarnov, Arlington, MA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/947,809

(22) Filed: Sep. 5, 2001

(51) Int. Cl.[7] ............................................. H03K 17/62
(52) U.S. Cl. ...................................... 327/407; 327/403
(58) Field of Search ................................. 327/407, 403, 327/277; 326/37–41; 365/230.02, 230.06

(56) References Cited

U.S. PATENT DOCUMENTS 4,926,423 A * 5/1990 Zukowski ................... 327/407
6,118,300 A * 9/2000 Wittig et al. ................... 326/41
6,124,736 A * 9/2000 Yamashita et al. ........... 326/113

OTHER PUBLICATIONS

Yamashita, S. : Performance–Driven Functional Decomposition And Circuit Minimization, Last Modified: Wed, Oct. 14, 1998, pp. 1–2.

* cited by examiner

*Primary Examiner*—Terry D. Cunningham
*Assistant Examiner*—Long Nguyen
(74) *Attorney, Agent, or Firm*—Thomas M. Croft

(57) ABSTRACT

A multiplexer is implemented in multiple stages. In an exemplary embodiment, a four-to-one multiplexer is transformed into two four-input logic functions to facilitate a field-programmable-gate-array implementation.

10 Claims, 4 Drawing Sheets

| $c_0$ | $c_1$ | $f_1$ |
|---|---|---|
| 0 | 0 | 0 | $(\Rightarrow a_3)$
| 0 | 1 | $a_1$ |
| 1 | 0 | 1 | $(\Rightarrow a_2)$
| 1 | 1 | $a_0$ |

FIG. 2A

| $c_1$ | $f_1$ | $f$ |
|---|---|---|
| 0 | 0 | $a_3$ |
| 0 | 1 | $a_2$ |
| 1 | $a_0$ | $a_0$ |
| 1 | $a_1$ | $a_1$ |

| $a_0$ | $a_1$ | $c_0$ | $c_1$ | $f_1$ |
|---|---|---|---|---|
| 0 | 0 | 0 | 0 | 0 |
| 0 | 0 | 0 | 1 | 0 |
| 0 | 0 | 1 | 0 | 1 |
| 0 | 0 | 1 | 1 | 0 |
| 0 | 1 | 0 | 0 | 0 |
| 0 | 1 | 0 | 1 | 1 |
| 0 | 1 | 1 | 0 | 1 |
| 0 | 1 | 1 | 1 | 0 |
| 1 | 0 | 0 | 0 | 0 |
| 1 | 0 | 0 | 1 | 0 |
| 1 | 0 | 1 | 0 | 1 |
| 1 | 0 | 1 | 1 | 1 |
| 1 | 1 | 0 | 0 | 0 |
| 1 | 1 | 0 | 1 | 1 |
| 1 | 1 | 1 | 0 | 1 |
| 1 | 1 | 1 | 1 | 1 |

FIG. 3A

| $c_1$ | $f_1$ | $a_2$ | $a_3$ | $f$ |
|---|---|---|---|---|
| 0 | 0 | 0 | 0 | 0 |
| 0 | 0 | 0 | 1 | 1 |
| 0 | 0 | 1 | 0 | 0 |
| 0 | 0 | 1 | 1 | 1 |
| 0 | 1 | 0 | 0 | 0 |
| 0 | 1 | 0 | 1 | 0 |
| 0 | 1 | 1 | 0 | 1 |
| 0 | 1 | 1 | 1 | 1 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

FIG. 3B

APPARATUS AND METHOD FOR IMPLEMENTING A MULTIPLEXER

FIELD OF THE INVENTION

The present invention relates generally to digital logic circuits and more specifically to an apparatus and method for implementing a multiplexer.

BACKGROUND OF THE INVENTION

Multiplexers are used extensively in many applications such as computers and telecommunications. For example, multiplexers comprise the primary portion of the register file in a field-programmable-gate-array (FPGA) implementation of a microprocessor. The problem sometimes arises, however, that the multiplexer function does not map efficiently onto four-input look-up tables, which are the basic logical building block of many FPGAs. Specifically, some FPGA synthesis tools use additional logic available in the majority of FPGAs to fit, for example, a four-to-one multiplexer into two four-input look-up tables. Unfortunately, use of this additional logic makes it unavailable for other uses and complicates the process of placement and routing. It is thus apparent that there is a need in the art for an improved multiplexer implementation.

SUMMARY OF THE INVENTION

An apparatus and associated method are provided for implementing a multiplexer. The multiplexing function is divided into two stages, the first of which outputs either a selection result or a selection signal. The selection result corresponds to one of a first set of data inputs to the first stage. The second stage selects one of a second set of data inputs to the second stage in response to the selection signal.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 2A is a partial truth table associated with a first stage of a four-to-one multiplexer implementation in accordance with an exemplary embodiment of the invention.

FIG. 2B is a partial truth table associated with a second stage of a four-to-one multiplexer implementation in accordance with an exemplary embodiment of the invention.

FIG. 3A is a complete truth table associated with a first stage of a four-to-one multiplexer implementation in accordance with an exemplary embodiment of the invention.

FIG. 3B is a complete truth table associated with a second stage of a four-to-one multiplexer implementation in accordance with an exemplary embodiment of the invention.

DETAILED DESCRIPTION OF THE INVENTION

Although the invention will be described in connection with an exemplary embodiment involving a four-to-one multiplexer, the invention may be extended to any N-to-one multiplexer circuit, where N is a positive-integer power of four. As those skilled in the art will recognize, an N-to-one multiplexer has $\log_2(N)$ selection inputs for selecting which input appears at the output. The general approach is as follows. The N data inputs are divided into two sets of $$\frac{N}{2}$$

data inputs associated with a first stage and a second stage, respectively. In the first stage, a first logic function operates upon the first set of data inputs, along with the $\log_2(N)$ selection inputs, to produce an output that serves a dual purpose. In the second stage, a second logic function operates upon the second set of data inputs, at least one of the $\log_2(N)$ selection inputs, and the output of the first stage to produce the final output, which is the desired one of the N inputs. Under a first set of states of the selection inputs, the output of the first stage is a selection result corresponding to one of the data inputs in the first set of data inputs. In this case, the data input in the first set of data inputs to which the selection result corresponds ultimately appears as the output of the second stage. Under a second set of states of the selection inputs, the output of the first stage is a selection signal. In this case, the second stage selects one of the data inputs in the second set of data inputs in response to the selection signal. Each stage has a total of N inputs, including selection inputs. The advantages of such a two-stage multiplexer implementation will become apparent as an exemplary embodiment of the invention is described.

Figure 1:
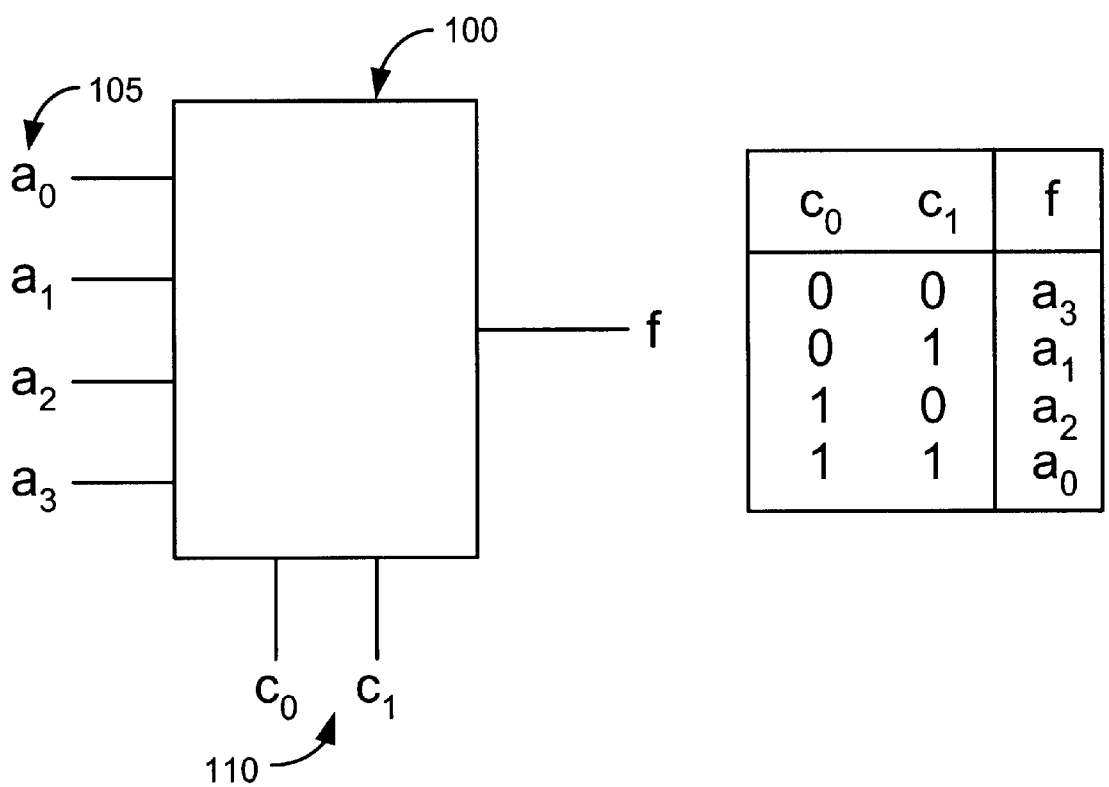
FIG. 1 is a block diagram and associated truth table of a four-to-one multiplexer that may be implemented using the invention.

FIG. 1 is a block diagram and associated truth table of a four-to-one multiplexer that may be implemented using the invention. Four-to-one multiplexer 100 operates upon data inputs 105 and selection inputs 10 to produce output $f$. The truth table in FIG. 1 shows the relationship between all the possible states of selection inputs 110 and the output $f$. Although FIG. 1 shows one particular convention for logic polarities and order of selection inputs 10, the invention may be applied to multiplexers defined according to different conventions. A Boolean expression corresponding to the block diagram of FIG. 1 is $$f = a_0 c_0 c_1 + a_1 \overline{c_0} c_1 + a_2 c_0 \overline{c_1} + a_3 \overline{c_0}\, \overline{c_1}. \quad \text{(Equation 1)}$$

As explained previously, Equation 1 may be divided into two stages, each having N=4 total inputs (data and selection). A Boolean expression for the first stage may be written as follows:

$$f_1 = c_1(a_0 c_0 + a_1 \overline{c_0}) + c_0\, \overline{c_1}. \quad \text{(Equation 2)}$$

The second stage may then be represented in Boolean form by $$f = c_1 f_1 + \overline{c_1}(a_2 f_1 + a_3 \overline{f_1}). \quad \text{(Equation 3)}$$

FIGS. 2A and 2B show partial truth tables corresponding to Equation 2 and Equation 3, respectively, in accordance with an exemplary embodiment of the invention. Note that for two combinations of selection inputs 110 in FIG. 2A, $f_1$ is a selection result equal to one of the two first-stage data inputs, $\alpha_0$ and $\alpha_1$. In this case, the applicable value ($\alpha_0$ or $\alpha_1$) ultimately appears as the output $f$. For the other two combinations, $f_1$ is a selection signal. In this case, the second stage ultimately selects $\alpha_3$ ($f_1$=logical "0") or $\alpha_2$ ($f_1$= logical "1") as the output $f$ in response to the selection signal. FIG. 2B shows the output $f$ as a function of second-stage inputs $f_1$ and $c_1$.

FIGS. 3A and 3B are complete truth tables corresponding to Equation 2 and Equation 3, respectively, in accordance with an exemplary embodiment of the invention. In this form, with four total inputs to each stage, the four-to-one multiplexer may be mapped readily onto two four-input FPGA look-up tables.

Figure 4:
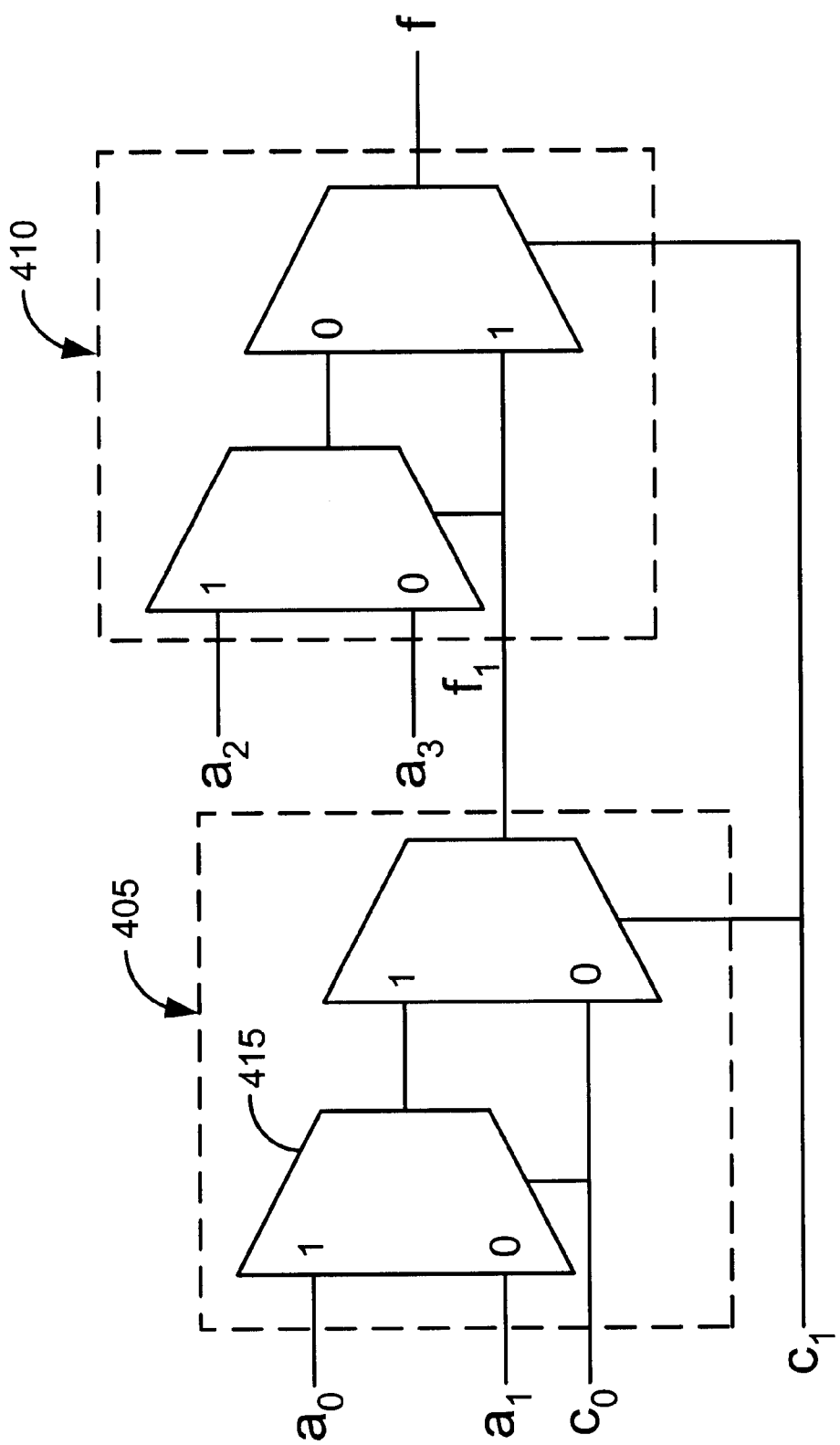
FIG. 4 is a circuit diagram corresponding to the truth tables of the exemplary embodiment of the invention shown in FIGS. 2A, 2B, 3A, and 3B.

FIG. 4 is a circuit diagram corresponding to Equations 2 and 3 and the associated truth tables shown in FIGS. 2A, 2B, 3A, and 3B in accordance with an exemplary embodiment of the invention. The circuit in FIG. 4 is divided into first stage 405 and second stage 410. Each stage comprises two two-to-one multiplexers 415 connected as indicated. Note that, in each stage, one input serves the function of both data input and selection input. In the first stage, that input is $c_0$; in the second, $f_1$. Selection input $c_1$ determines whether $f_1$ or one of $\alpha_2$ and $\alpha_3$ appears at the output of the second stage.

As mentioned previously, the invention may also be applied to larger multiplexers such as a 16-to-one. In this case, each stage may be implemented using two four-to-one multiplexers.

The foregoing description of the present invention has been presented for the purposes of illustration and description. It is not intended to be exhaustive or to limit the invention to the precise form disclosed, and other modifications and variations may be possible in light of the above teachings. The exemplary embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A circuit, comprising a first stage and a second stage, each stage comprising at least two data inputs, at least two selection inputs, and an output, the output of the first stage comprising, responsive to the at least two selection inputs, one of a selection result and a selection signal, the selection result corresponding to one of the data inputs to the first stage the selection signal corresponding to one of the selection inputs to the first stage, the second stage selecting one of the data inputs to the second stage in response to the selection signal.

2. The circuit of claim 1, wherein, in each stage, the at least two data inputs comprise data inputs of a first multiplexer, a first of the at least two selection inputs comprises a selection input of the first multiplexer, an output of the first multiplexer is connected with a first data input of a second multiplexer, the first of the at least two selection inputs is connected with a second data input of the second multiplexer, a second of the at least two selection inputs comprises a selection input of the second multiplexer, and an output of the second multiplexer comprises the output of the stage.

3. The circuit of claim 1, wherein at least one of the first stage and the second stage is implemented using a field-programmable gate array.

4. A four-to-one multiplexer circuit, comprising a first stage and a second stage, the first stage having first and second data inputs, first and second selection inputs, and a first output, the second stage having third and fourth data inputs, a third selection input connected with the first output, a fourth selection input connected with the second selection input, and a second output, the first output comprising one of a selection result and a selection signal, the selection result corresponding to one of the first and second data inputs, the selection signal corresponding to one of the first and second selection inputs the second stage selecting one of the third and fourth data inputs in response to the selection signal.

5. The four-to-one multiplexer circuit of claim 4, wherein the first and second data inputs comprise first and second data inputs to a first two-to-one multiplexer, the first selection input comprises a selection input to the first two-to-one multiplexer, an output of the first two-to-one multiplexer is connected with a first data input of a second two-to-one multiplexer, the first selection input is connected with a second data input of the second two-to-one multiplexer, the second selection input comprises a selection input of the second two-to-one multiplexer, the first output comprises an output of the second two-to-one multiplexer, the third and fourth data inputs comprise first and second data inputs of a third two-to-one multiplexer, the output of the second two-to-one multiplexer is connected with a first data input of a fourth two-to-one multiplexer and with a selection input of the third two-to-one multiplexer, an output of the third two-to-one multiplexer is connected with a second data input of the fourth two-to-one multiplexer, the fourth selection input comprises a selection input of the fourth two-to-one multiplexer, and the second output comprises an output of the fourth two-to-one multiplexer.

6. The four-to-one multiplexer circuit of claim 4, wherein at least one of the first stage and the second stage is implemented using a field-programmable gate array.

7. A circuit for selecting an output from among N data inputs, comprising:

means for generating one of a selection result and a selection signal responsive to at least one selection input, the selection result corresponding to one of a first set of data inputs, the signal corresponding to one of the at least one selection input; and means for choosing as the output one of the first set of data inputs, when the selection result is generated, and one of a second set of data inputs, when the selection signal is generated.

8. The circuit for selecting an output from among N data inputs of claim 7, wherein the means for generating and the means for choosing are implemented using a field-programmable gate array.

9. A method for implementing an N-to-one multiplexer, N being a positive-integer power of four, the method comprising:

partitioning N data inputs into first and second disjoint sets of data inputs, each set of data inputs having $$\frac{N}{2}$$

data inputs;

evaluating a first logic function having a first set of inputs and a first output, the first set of inputs comprising the first set of data inputs and $\log_2(N)$ selection inputs, the first output comprising one of a selection result and a selection signal, the selection result corresponding to one of the first set of data inputs, the selection signal corresponding to one of the $\log_2(N)$ selection inputs; and evaluating a second logic function having a second set of inputs and a second output, the second set of inputs comprising the second set of data inputs and a least one of the selection inputs, the second output corresponding to one of the first set of data inputs, when the first output comprises the selection result, the second output corresponding to one of the second set of data inputs, when the first output comprises the selection signal.

10. The method of claim 9, wherein at least one of the first and second logic functions is programmed in a field-programmable gate array.

* * * * *